US009075673B2

(12) United States Patent
Khlat et al.

(10) Patent No.: US 9,075,673 B2
(45) Date of Patent: Jul. 7, 2015

(54) DIGITAL FAST DB TO GAIN MULTIPLIER FOR ENVELOPE TRACKING SYSTEMS

(75) Inventors: Nadim Khlat, Cugnaux (FR); Shanthi Prasad, Cupertino, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/297,470

(22) Filed: Nov. 16, 2011

(65) Prior Publication Data

US 2012/0119813 A1    May 17, 2012

Related U.S. Application Data

(60) Provisional application No. 61/414,085, filed on Nov. 16, 2010.

(51) Int. Cl.
| | | |
|---|---|---|
| H04L 27/08 | (2006.01) | |
| G06F 7/556 | (2006.01) | |
| H03M 7/04 | (2006.01) | |
| G06F 1/03 | (2006.01) | |

(52) U.S. Cl.
CPC .............. *G06F 7/556* (2013.01); *H03M 7/04* (2013.01); *G06F 1/0307* (2013.01)

(58) Field of Classification Search
CPC .............................. G06F 1/0307; G06F 7/556
USPC ................... 375/345; 332/106, 115; 708/277
See application file for complete search history.

(56) References Cited

U.S. PATENT DOCUMENTS

| | | |
|---|---|---|
| 3,969,682 A | 7/1976 | Rossum |
| 3,980,964 A | 9/1976 | Grodinsky |
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A * | 9/1992 | Pinckley ....................... 704/225 |
| 5,187,396 A | 2/1993 | Armstrong, II et al. |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |

(Continued)

FOREIGN PATENT DOCUMENTS

| | | |
|---|---|---|
| CN | 1211355 A | 3/1999 |
| CN | 101201891 A | 6/2008 |

(Continued)

OTHER PUBLICATIONS

Non-final Office Action for U.S. Appl. No. 13/218,400 mailed Nov. 8, 2012, 7 pages.

(Continued)

*Primary Examiner* — Sam K Ahn
*Assistant Examiner* — Fabricio R Murillo Garcia
(74) *Attorney, Agent, or Firm* — Withrow & Terranova, P.L.L.C.

(57) ABSTRACT

A digital log gain to digital linear gain multiplier is disclosed. The digital log gain to digital linear gain multiplier includes a log gain splitter adapted to split a log gain input into an integer log part and a remainder log part. A log scale-to-linear scale converter is adapted to output a linear gain value in response to the integer log part and the remainder log part. A gain multiply circuit is adapted to multiply a digital signal by the linear gain value to output a gain-enhanced digital signal.

17 Claims, 6 Drawing Sheets

(56) References Cited

U.S. PATENT DOCUMENTS

| | | |
|---|---|---|
| 5,420,643 A | 5/1995 | Romesburg et al. |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1* | 9/2003 | Cygan et al. ............... 332/106 |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,058,373 B2 | 6/2006 | Grigore |
| 7,099,635 B2 | 8/2006 | McCune |
| 7,164,893 B2 | 1/2007 | Leizerovich et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,279,875 B2 | 10/2007 | Gan et al. |
| 7,348,847 B2 | 3/2008 | Whittaker |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,856,048 B1 | 12/2010 | Smaini et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,718,582 B2 | 5/2014 | See et al. |
| 8,744,382 B2 | 6/2014 | Hou et al. |
| 8,824,978 B2 | 9/2014 | Briffa et al. |
| 8,829,993 B2 | 9/2014 | Briffa et al. |
| 8,909,175 B1 | 12/2014 | McCallister |
| 8,947,162 B2 | 2/2015 | Wimpenny et al. |
| 8,981,847 B2 | 3/2015 | Balteanu |
| 2002/0071497 A1 | 6/2002 | Bengtsson et al. |
| 2003/0017286 A1 | 1/2003 | Williams et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1* | 8/2003 | Hughes et al. ............... 455/138 |
| 2003/0198063 A1 | 10/2003 | Smyth |
| 2003/0206603 A1 | 11/2003 | Husted |
| 2003/0220953 A1* | 11/2003 | Allred ............... 708/277 |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0184569 A1* | 9/2004 | Challa et al. ............... 375/345 |
| 2004/0196095 A1 | 10/2004 | Nonaka |
| 2004/0219891 A1 | 11/2004 | Hadjichristos |
| 2004/0239301 A1 | 12/2004 | Kobayashi |

(56) References Cited

U.S. PATENT DOCUMENTS

| | | |
|---|---|---|
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0063681 A1 | 3/2007 | Liu |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0184794 A1 | 8/2007 | Drogi et al. |
| 2007/0259628 A1 | 11/2007 | Carmel et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0082006 A1 | 3/2009 | Pozsgay et al. |
| 2009/0097591 A1 | 4/2009 | Kim |
| 2009/0160548 A1 * | 6/2009 | Ishikawa et al. .............. 330/127 |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 * | 7/2009 | Kazakevich et al. ......... 375/345 |
| 2009/0191826 A1 * | 7/2009 | Takinami et al. ............. 455/110 |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0017553 A1 | 1/2010 | Laurencin et al. |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2011/0018626 A1 | 1/2011 | Kojima |
| 2011/0058601 A1 * | 3/2011 | Kim et al. .................... 375/238 |
| 2011/0084760 A1 | 4/2011 | Guo et al. |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0299647 A1 | 11/2012 | Honjo et al. |
| 2013/0034139 A1 | 2/2013 | Khlat et al. |
| 2013/0094553 A1 | 4/2013 | Paek et al. |
| 2013/0169245 A1 | 7/2013 | Kay et al. |
| 2013/0214858 A1 | 8/2013 | Tournatory et al. |
| 2013/0229235 A1 | 9/2013 | Ohnishi |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |

FOREIGN PATENT DOCUMENTS

| | | |
|---|---|---|
| CN | 101867284 A | 10/2010 |
| EP | 0755121 A2 | 1/1997 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| WO | 0048306 A1 | 8/2000 |
| WO | 04002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Notice of Allowance for U.S. Appl. No. 13/316,229 mailed Nov. 14, 2012, 9 pages.

Non-final Office Action for U.S. Appl. No. 13/222,484 mailed Nov. 8, 2012, 9 pages.

International Preliminary Report on Patentability for PCT/US11/49243 mailed Nov. 13, 2012, 33 pages.

Non-final Office Action for U.S. Appl. No. 13/089,917 mailed Nov. 23, 2012, 6 pages.

Non final Office Action for 13/222,453 mailed Dec. 6, 2012, 13 pages.

(56) References Cited

OTHER PUBLICATIONS

International Preliminary Report on Patentability for PCT/US2011/033037 mailed Oct. 23, 2012, 7 pages.
International Search Report for PCT/US2011/054106 mailed Feb. 9, 2012, 11 pages.
International Search Report for PCT/US12/40317 mailed Sep. 7, 2012, 7 pages.
International Search Report for PCT/US2012/046887 mailed Dec. 21, 2012, 12 pages.
Non-Final Office Action for U.S. Appl. No. 13/188,024, mailed Feb. 5, 2013, 8 pages.
International Search Report and Written Opinion for PCT/US2012/062070, mailed Jan. 21, 2013, 12 pages.
Dixon, N., "Standardization boosts momentum for Envelope tracking," Microwave Engineers, Europe, Apr. 20, 2011, 2 pages, http://www.mwee.com/en/standardisation-boosts-momentum-for-envelope-tracking.html?cmp_ids=71&news_ids=222901746.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 20-24, 2010, pp. 210-212.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira files 100th envelope tracking patent," CS: Compound Semiconductor, Apr. 11, 2011, 1 page.
Non-final Office Action for U.S. Appl. No. 12/112,006 mailed Apr. 5, 2010, 6 pages.
Notice of Allowance for U.S. Appl. No. 12/112,006 mailed Jul. 19, 2010, 6 pages.
International Search Report for PCT1US11/033037 mailed Aug. 9, 2011, 10 pages.
International Search Report for PCT/US2011/044857 mailed Oct. 24, 2011, 10 pages.
International Search Report for PCT/US11/49243 mailed Dec. 22, 2011, 9 pages.
Non-final Office Action for U.S. Appl. No. 11/113,873, now Patent No. 7,773,691 mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
Kim, N. et al, "Ripple feedback filter suitable for analog/digital mixed-mode audio amplifier for improved efficiency and stability," Power Electronics Specialists Conference, vol. 1, Jun. 23, 2002, pp. 45-49.
International Search Report for PCT/US06/12619 mailed May 8, 2007, 2 pages.
International Search Report and Written Opinion for PCT/US2011/061009 mailed Feb. 8, 2012, 14 pages
Invitation to Pay Additional Fees and Where Applicable Protest Fee for PCT/US2011/061007 mailed Feb. 13, 2012, 7 pages.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
International Search Report for PCT/US2011/064255 mailed Apr. 3, 2012, 12 pages.
Extended European Search Report for application 06740532.4 mailed Dec. 7, 2010, 7 pages.

Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
International Search Report for PCT/US2012/023495 mailed May 7, 2012, 13 pages.
Hekkala, A. et al., "Adaptive time misalignment compensation in envelope tracking amplifiers," International Symposium on Spread Spectrum Techniques and Applications, Aug. 2008, pp. 761-765.
Invitation to Pay Additional Fees and Where Applicable Protest Fee for PCT/US2012/024124 mailed Jun. 1, 2012, 7 pages.
Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
International Search Report for PCT/US2011/061007 mailed Aug. 16, 2012, 16 pages.
International Search Report for PCT/US2012/024124 mailed Aug. 24, 2012, 14 pages.
International Search Report for US PCT/US2012/036858 mailed Aug. 9, 2012, 7 pages.
International Search Report for US PCT/US2012/036858 mailed Aug. 10, 2012, 8 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
International Preliminary Report on Patentability for PCT/US2011/064255, mailed Jun. 20, 2013, 7 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
Notice of Allowance for U.S. Appl. No. 13/188,024, mailed Jun. 18, 2013, 8 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
Notice of Allowance for U.S. Appl. No. 13/343,840, mailed Jul. 1, 2013, 8 pages.
International Preliminary Report on Patentability for PCT/US2012/024124, mailed Aug. 22, 2013, 8 pages.
International Preliminary Report on Patentability for PCT/US2012/023495, mailed Aug. 15, 2013, 10 pages.

(56) References Cited

OTHER PUBLICATIONS

International Preliminary Report on Patentability for PCT/US2011/044857 mailed Mar. 7, 2013, 6 pages.
International Search Report and Written Opinion for PCT/US2012/053654 mailed Feb. 15, 2013, 11 pages.
International Search Report and Written Opinion for PCT/US2012/067230 mailed Feb. 21, 2013, 10 pages.
Notice of Allowance for U.S. Appl. No. 13/218,400 mailed Apr. 11, 2013, 7 pages.
Notice of Allowance for U.S. Appl. No. 13/222,453 mailed Feb. 21, 2013, 7 pages.
Final Office Action for U.S. Appl. No. 13/222,484 mailed Apr. 10, 2013, 10 pages.
Notice of Allowance for U.S. Appl. No. 14/022,858, mailed Oct. 25, 2013, 9 pages.
Non-Final Office Action for U.S. Appl. No. 13/550,049, mailed Nov. 25, 2013, 6 pages.
Non-Final Office Action for U.S. Appl. No. 12/836,307, mailed Nov. 5, 2013, 6 pages.
Examination Report for European Patent Application No. 11720630, mailed Aug. 16, 2013, 5 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
International Preliminary Report on Patentability for PCT/US2012/040317, mailed Dec. 12, 2013, 5 pages.
Notice of Allowance for U.S. Appl. No. 13/531,719, mailed Dec. 30, 2013, 7 pages.
Non-Final Office Action for U.S. Appl. No. 14/022,940, mailed Dec. 20, 2013, 5 pages.
International Search Report and Written Opinion for PCT/US2013/052277, mailed Jan. 7, 2014, 14 pages.
Notice of Allowance for U.S. Appl. No. 13/297,490, mailed Feb. 27, 2014, 7 pages.
Notice of Allowance for U.S. Appl. No. 13/550,049, mailed Mar. 6, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
Non-Final Office Action for U.S. Appl. No. 13/661,552, mailed Feb. 21, 2014, 5 pages.
International Search Report and Written Opinion for PCT/US2013/065403, mailed Feb. 5, 2014, 11 pages.
Notice of Allowance for U.S. Appl. No. 12/836,307 mailed May 5, 2014, 6 pages.
Notice of Allowance for U.S. Appl. No. 14/022,858 mailed May 27, 2014, 6 pages.
Non-Final Office Action for U.S. Appl. No. 13/367,973 mailed Apr. 25, 2014, 5 pages.
Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.
Non-Final Office Action for U.S. Appl. No. 13/692,084 mailed Apr. 10, 2014, 6 pages.
Non-Final Office Action for U.S. Appl. No. 13/684,826 mailed Apr. 3, 2014, 5 pages.
Notice of Allowance for U.S. Appl. No. 14/022,940, mailed Jun. 10, 2014, 7 pages.
Non-Final Office Action for U.S. Appl. No. 13/714,600 mailed May 9, 2014, 14 pages.
Non-Final Office Action for U.S. Appl. No. 13/951,976 mailed Apr. 4, 2014, 7 pages.
Examination Report for European Patent Application No. 11720630.0 issued Mar. 18, 2014, 4 pages.
International Preliminary Report on Patentability for PCT/US2012/062070 mailed May 8, 2014, 8 pages.
International Search Report and Written Opinion for PCT/US2012/062110 issued Apr. 8, 2014, 12 pages.
International Preliminary Report on Patentability for PCT/US2012/062110 mailed May 8, 2014, 9 pages.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al, "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
European Search Report for Patent Application No. 14162682.0, issued Aug. 27, 2014, 7 pages.
International Preliminary Report on Patentability and Written Opinion for PCT/US2012/067230, mailed Jun. 12, 2014, 7 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
Notice of Allowance for U.S. Appl. No. 14/072,140, mailed Aug. 27, 2014, 8 pages.
Non-Final Office Action for U.S. Appl. No. 14/072,225, mailed Aug. 15, 2014, 4 pages.
Non-Final Office Action for U.S. Appl. No. 13/486,012, mailed Jul. 28, 2014, 7 pages.
Notice of Allowance for U.S. Appl. No. 13/548,283, mailed Sep. 3, 2014, 7 pages.
Non-Final Office Action for U.S. Appl. No. 13/689,883, mailed Aug. 27, 2014, 12 pages.
Notice of Allowance for U.S. Appl. No. 13/661,552, mailed Jun. 13, 2014, 5 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
Notice of Allowance for U.S. Appl. No. 13/684,826, mailed Jul. 18, 2014, 7 pages.
Non-Final Office Action for U.S. Appl. No. 13/782,142, mailed Sep. 4, 2014, 6 pages.
Non-Final Office Action for U.S. Appl. No. 12/836,307, mailed Sep. 25, 2014, 5 pages.
Notice of Allowance for U.S. Appl. No. 13/367,973, mailed Sep. 15, 2014, 7 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
Extended European Search Report for European Patent Application No. 12794149.0, issued Oct. 29, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
First Office Action for Chinese Patent Application No. 201280026559.0, issued Nov. 3, 2014, 14 pages (with English translation0.
Notice of Allowance for U.S. Appl. No. 14/072,140, mailed Dec. 2, 2014, 8 pages.
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.

(56) References Cited

OTHER PUBLICATIONS

Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Notice of Allowance for U.S. Appl. No. 12/836,307, mailed Mar. 2, 2015, 6 pages.
Non-Final Office Action for U.S. Appl. No. 14/122,852, mailed Feb. 27, 2015, 5 pages.
Advisory Action for U.S. Appl. No. 13/689,883, mailed Apr. 20, 2015, 3 pages.
Advisory Action for U.S. Appl. No. 13/661,227, mailed May 12, 2015, 3 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Notice of Allowance for U.S. Appl. No. 13/747,725, mailed May 13, 2015, 9 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
Non-Final Office Action for U.S. Appl. No. 13/689,940, mailed May 14, 2015, 7 pages.
European Search Report for European Patent Application No. 14190851.7, issued Mar. 5, 2015, 6 pages.
International Preliminary Report on Patentability for PCT/US2013/065403, mailed Apr. 30, 2015, 8 pages.

\* cited by examiner

DIGITAL FAST DB TO GAIN MULTIPLIER FOR ENVELOPE TRACKING SYSTEMS

RELATED APPLICATIONS

This application claims the benefit of U.S. provisional patent application Ser. No. 61/414,085, filed Nov. 16, 2010, the disclosure of which is incorporated herein by reference in its entirety. This application is also related to a concurrently filed utility application entitled DIGITAL FAST CORDIC FOR ENVELOPE TRACKING GENERATION, U.S. patent application Ser. No. 13/297,490, filed Nov. 16, 2011, the disclosure of which is incorporated herein by reference in its entirety.

FIELD OF THE DISCLOSURE

The present disclosure relates to a digital log gain to digital linear gain multiplier that outputs a gain-enhanced digital signal.

BACKGROUND

An envelope tracking system generates an envelope tracking signal (ETS) that is used as a reference input for a fast switched-mode power supply (Fast SMPS). In turn, the Fast SMPS uses the envelope signal to modulate a supply of a power amplifier for an increased efficiency. At present, an ETS generated by traditional methods is not fast or accurate enough for use with the long term evolution (LTE) standard wherein an envelope modulation bandwidth can be as high as 1.5 times a modulation bandwidth. In fact, a 20 MHz LTE bandwidth requires about 30 MHz envelope bandwidth, which further requires a digital sampling clock of 52 MHz or higher.

The ETS needs to be digitally scaled by a gain value to provide an equivalent amount of gain that is present between an I/Q signal and an RF envelope driving the power amplifier. The digitally scaled ETS corresponds to the RF envelope driving the power amplifier. As a result, there is a need for digital log gain to digital linear gain multiplier that receives a log gain value, converts the log gain value into a linear gain value and multiplies a digital signal to rapidly provide an accurate gain-enhanced digital signal that is usable to generate an ETS.

SUMMARY

A digital log gain to digital linear gain multiplier is disclosed. The digital log gain to digital linear gain multiplier includes a log gain splitter adapted to split a log gain input into an integer log part and a remainder log part. A log scale-to-linear scale converter is adapted to output a linear gain value in response to the integer log part and the remainder log part. A gain multiply circuit is adapted to multiply a digital signal by the linear gain value to output a gain-enhanced digital signal. In one embodiment, the digital log gain to digital linear gain multiplier is incorporated in a digital tracking system that generates an envelope tracking signal (ETS).

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
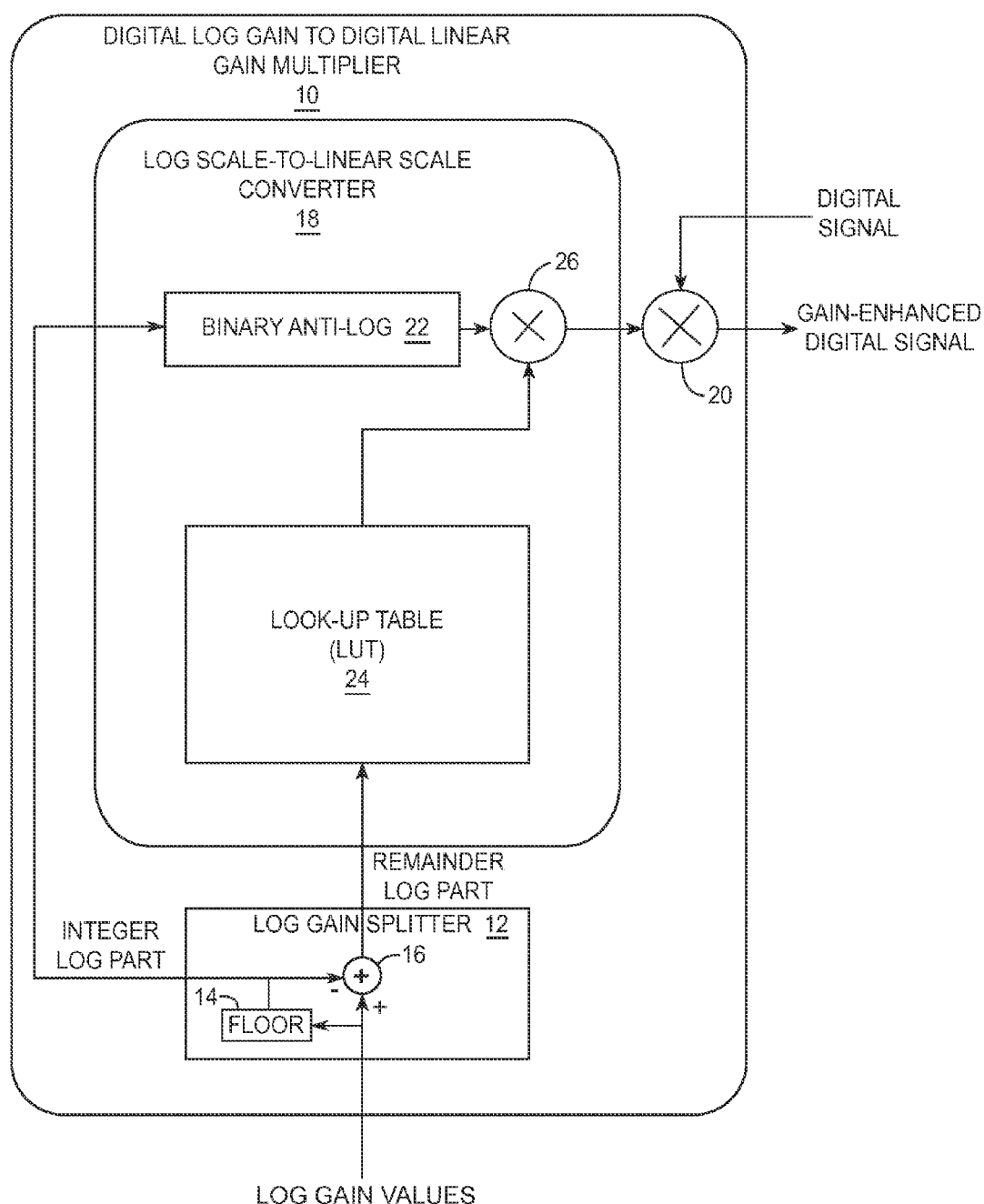
FIG. 1 is a first embodiment of the digital log gain to digital linear gain multiplier.

FIG. 1 is a first embodiment of the digital log gain to digital linear gain multiplier 10 that receives a log gain value, converts the log gain value into a linear gain value, and multiplies a digital signal to rapidly provide an accurate gain-enhanced digital signal. The digital log gain to digital linear gain multiplier 10 includes a log gain splitter 12 that splits a log gain input into an integer log part and a remainder log part. The integer log part is provided by a floor function circuit 14 that outputs the largest integer that is less than or equal to the log gain value. An adder circuit 16 outputs the remainder log part by summing the negative of the integer log part with the log gain value.

Further included is a log scale-to-linear scale converter 18 that outputs a linear gain value in response to the integer log part and the remainder log part. A gain multiply circuit 20 multiplies a digital signal by the linear gain value to output a gain-enhanced digital signal. The log scale-to-linear scale converter 18 includes a binary anti-log circuit 22 that outputs a binary anti-log value of the integer log part. Also included is a log-to-linear look-up table (LUT) 24 that outputs a LUT value that corresponds to the remainder log part. A converter multiply circuit 26 multiplies that anti-log value by the LUT value to produce the linear gain value output by the log scale-to-linear scale converter 18.

The first embodiment of the digital log gain to digital linear gain multiplier 10 is configured to receive log gain values that are base two decibels (dB2). The LUT 24 is configured to with LUT values generated using the following equation (1).

$$\text{LUT value} = 256 * 10^{(0.3012 * \text{REMAINDER LOG PART})} \quad (1)$$

Table 1 below provides a sample of LUT values that correspond to remainder log parts for log gain values in the form of dB2.

TABLE 1

| Remainder Log Part | 256 × Remainder Log Part | Equation (1) LUT Value |
|---|---|---|
| 0 | 0 | 256 |
| 0.0625 | 16 | 267 |
| 0.5 | 128 | 362 |
| 0.875 | 224 | 470 |
| 0.9961 | 255 | 511 |

In operation, the log gain values are received by the log gain splitter 12 in the form dB2. The following equation (2) coverts dB to dB2.

$$dB2 = \frac{dB}{20 * LOG_{10}(2)} \quad (2)$$

The equation (2) can be evaluated by an external processor (not shown). A log gain value in dB2 received by the log gain splitter 12 is split into an integer log part and a remainder log part via the floor function circuit 14 and the adder circuit 16. In particular, a negative of the log integer part is added to the log gain value in dB2 to provide the remainder log part. In turn, the remainder log part is used to select a corresponding LUT value from the LUT table 24. The Integer log part is processed by the binary anti-log circuit 22, which is based upon the following equation (3).

$$\text{Binary Anti-Log} = 2^{(INTEGER\ LOG\ PART)} \quad (3)$$

The converter multiply circuit 26 multiples the results from the binary anti-log circuit 22 by the LUT value to yield a linear gain value that is right shifted by one byte to divide the linear gain value by 256. Alternately, either the LUT value or the results from the binary anti-log circuit 22 can be right shifted by one byte to yield the same linear gain value. Finally, the gain multiply circuit 20 multiplies a digital signal input by the linear gain value to output a gain-enhanced digital signal. Table 2 below lists sample calculations that are performed by the digital log gain to digital linear gain multiplier 10 as configured in FIG. 1.

TABLE 2

| dB | dB2 | INTEGER LOG PART | REMAINDER LOG PART | LUT Value | BINARY ANTI-LOG | LINEAR GAIN VALUE |
|---|---|---|---|---|---|---|
| −20 | −3.322 | −3 | −0.32193 | 205 | 0.125 | 0.100 |
| −11 | −1.827 | −1 | −0.82706 | 144 | 0.5 | 0.28125 |
| 0 | 0 | 0 | 0 | 256 | 1 | 1 |
| 14 | 2.32535 | 2 | 0.32535 | 321 | 4 | 5.015625 |
| 23 | 3.820217 | 3 | 0.820217 | 452 | 8 | 14.125 |

Figure 2:
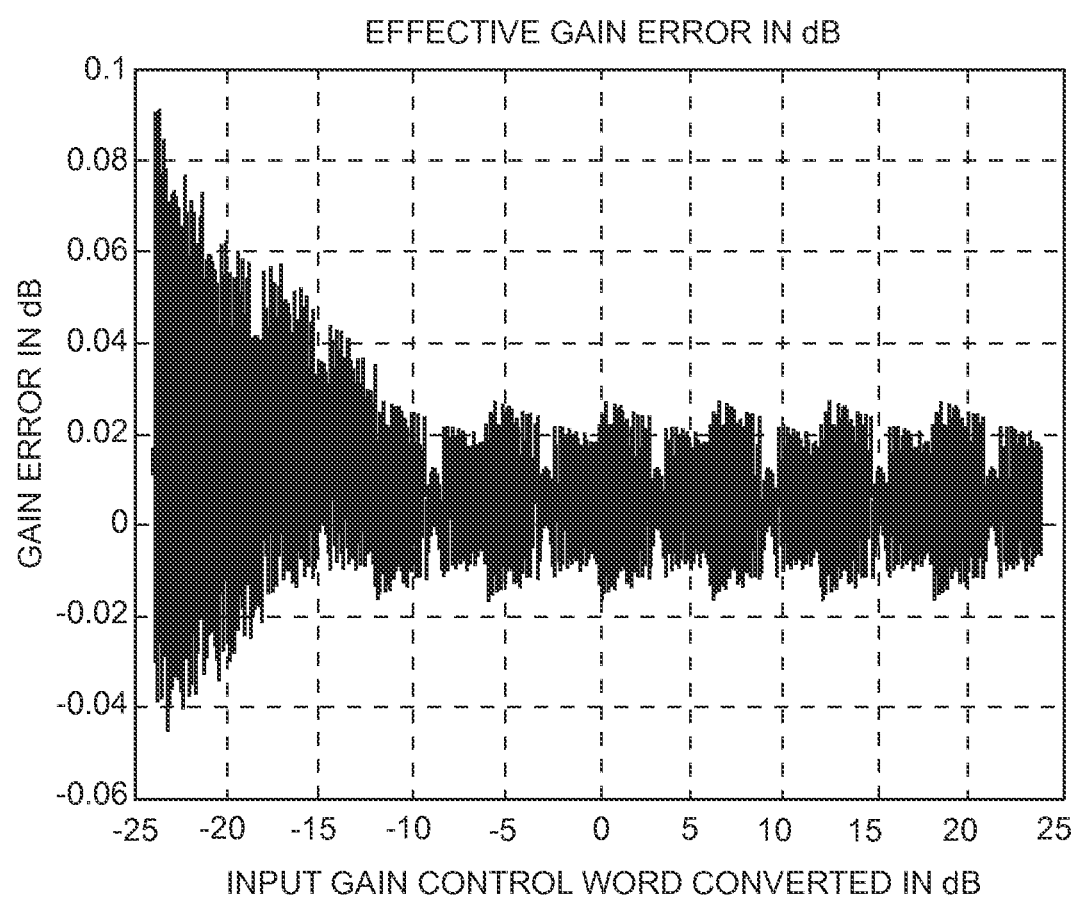
FIG. 2 is a graph of effective gain error versus input gain control word values for the first embodiment of FIG. 1.

FIG. 2 is a graph of effective gain error versus input gain control words that correspond to various log gain values for the first embodiment of the digital log gain to digital linear gain multiplier 10 (FIG. 1). In this case, the digital log gain to digital linear gain multiplier 10 is implemented as a dB2 to gain multiplier. Notice that the error over the +24/−12 dB range is less than ±0.03 dB when the error is expressed in dB. In this example, the input gain resolution is 0.00195 in dB2, which corresponds to nine bits or 0.0117 in dB, which corresponds to approximately six bits.

Figure 3:
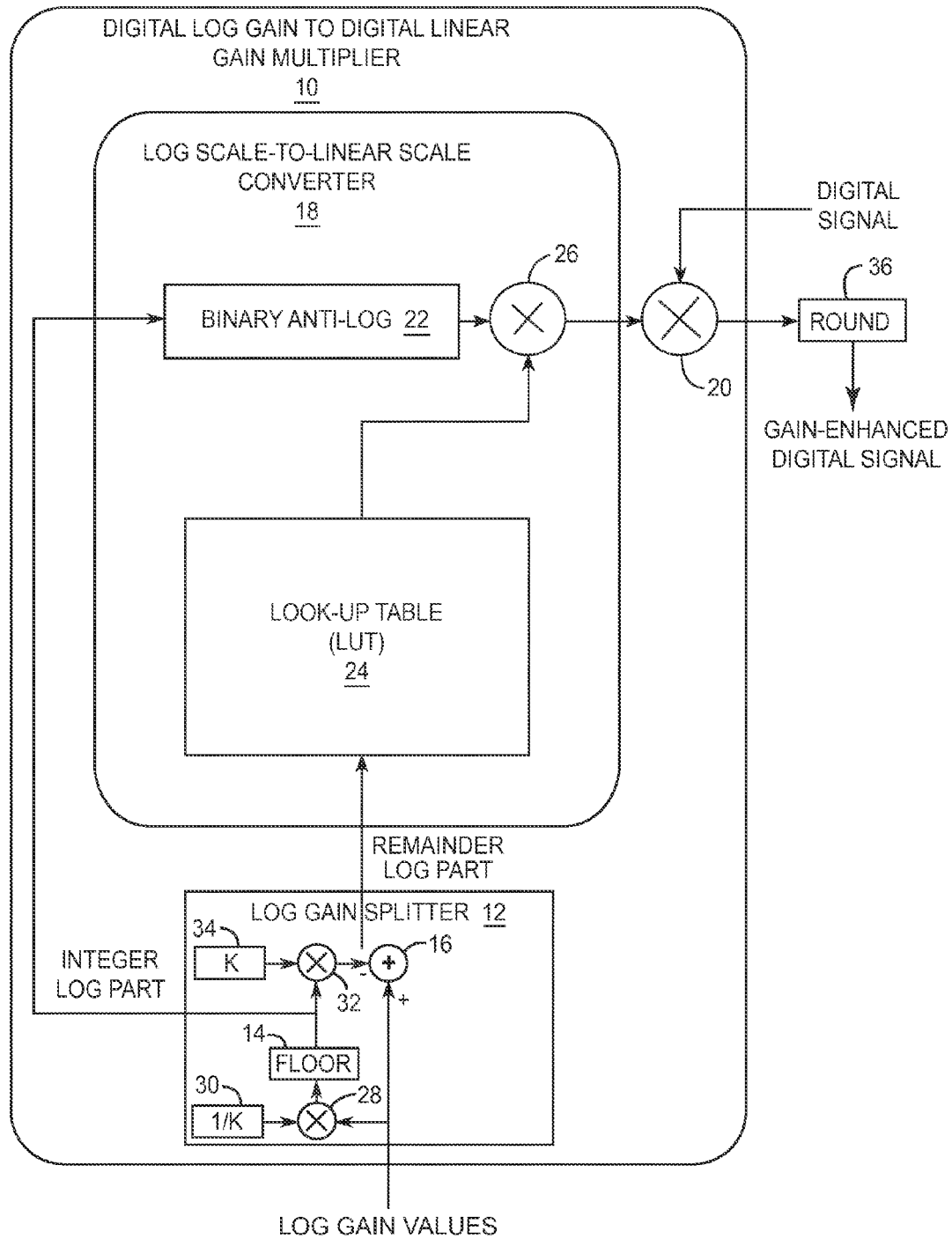
FIG. 3 is a second embodiment of the digital log gain to digital linear gain multiplier.

FIG. 3 is a second embodiment of the digital log gain to digital linear gain multiplier 10. In this embodiment, the log gain splitter 12 further includes a first scale multiply circuit 28 that multiplies the log gain value by a reciprocal scale constant 30 having a value of 1/K. Also included is a second scale multiply circuit 32 that multiplies the integer log part by a scale constant 34 having a value of K. If K is set to 1, the integer log part and the integer remainder part output from the log gain splitter 12 are identical to those outputted from the log gain splitter 12 as configured in the first embodiment of FIG. 1. However, an appropriate K can be selected such that linear gain values in the form of dB can be directly inputted into the log gain splitter 12. In this case, the appropriate value of K is twenty divided by the base two logarithm of ten (i.e., $20/\log_2(10)$).

An approximation of this value of K is encoded as 110.00000101 binary, which is 6.01953125 decimal. This value for K is stored in the log gain splitter 12 for the scale constant 34. Moreover, an approximation of 1/K is encoded as 0.00101011 binary, which is 0.16796875 decimal. This value for 1/K is stored in the log gain splitter 12 for the reciprocal scale constant 30.

In order to function properly with the above K value, the LUT 24 is configured to with LUT values generated using the following equation (4).

$$\text{LUT value} = 256 * 10^{(0.05 * REMAINDER\ LOG\ PART)} \quad (4)$$

Table 3 below provides a sample of LUT values that correspond to remainder log parts for dB log gain values.

TABLE 3

| Remainder Log Part | 32 × Remainder Log Part | Equation (2) LUT Value |
|---|---|---|
| −0.25 | −8 | 249 |
| 0 | 0 | 256 |
| 2.625 | 84 | 346 |
| 4.75 | 152 | 442 |
| 6.25 | 200 | 526 |

A linear gain value in the form of dB can be received directly by the log gain splitter 12 when the reciprocal scale constant 30 is set to 0.16796875 decimal and the scale constant 34 is set to 6.01953125 decimal. In operation, a log gain value in dB is first multiplied by the reciprocal scale constant 30 before being processed by the floor function circuit 14 to provide a corresponding integer log part. The integer log part is then multiplied by the scale constant 34 before being added to the log gain value in dB to provide the remainder log part. In turn, the remainder log part is used to select a corresponding LUT value from the LUT table 24. The converter multiply circuit 26 multiples the results from the binary anti-log circuit 22 by the LUT value to yield a linear gain value that is right shifted by one byte to divide the linear gain value by 256. Alternately, either the LUT value or the results from the binary anti-log circuit 22 can be right shifted by one byte to yield the same linear gain value. Finally, the gain multiply circuit 20 multiples a digital signal input by the linear gain value to output a gain-enhanced digital signal. Lastly, a rounding circuit 36 is an optional feature that rounds the digital values making up the gain-enhanced signal to a predetermined precision. In turn, the remainder log part is used to select a corresponding LUT value from the LUT table 24. Table 4 below lists sample calculations that are performed by the digital log gain to digital linear gain multiplier 10 configured to receive log gain values in the form of dB.

TABLE 4

| dB | dB/K | INTEGER LOG PART | REMAINDER LOG PART | LUT Value | BINARY ANTI-LOG | LINEAR GAIN VALUE |
|---|---|---|---|---|---|---|
| −20 | −3.35938 | −3 | −18.0579 | 205 | 0.125 | 0.1 |
| −11 | −1.84766 | −1 | −6.01931 | 144 | 0.5 | 0.28125 |
| 0 | 0 | 0 | 0 | 256 | 1 | 1 |
| 14 | 2.351563 | 2 | 1.961375 | 321 | 4 | 5.015625 |
| 23 | 3.863281 | 3 | 4.942063 | 452 | 8 | 14.125 |

Figure 4:
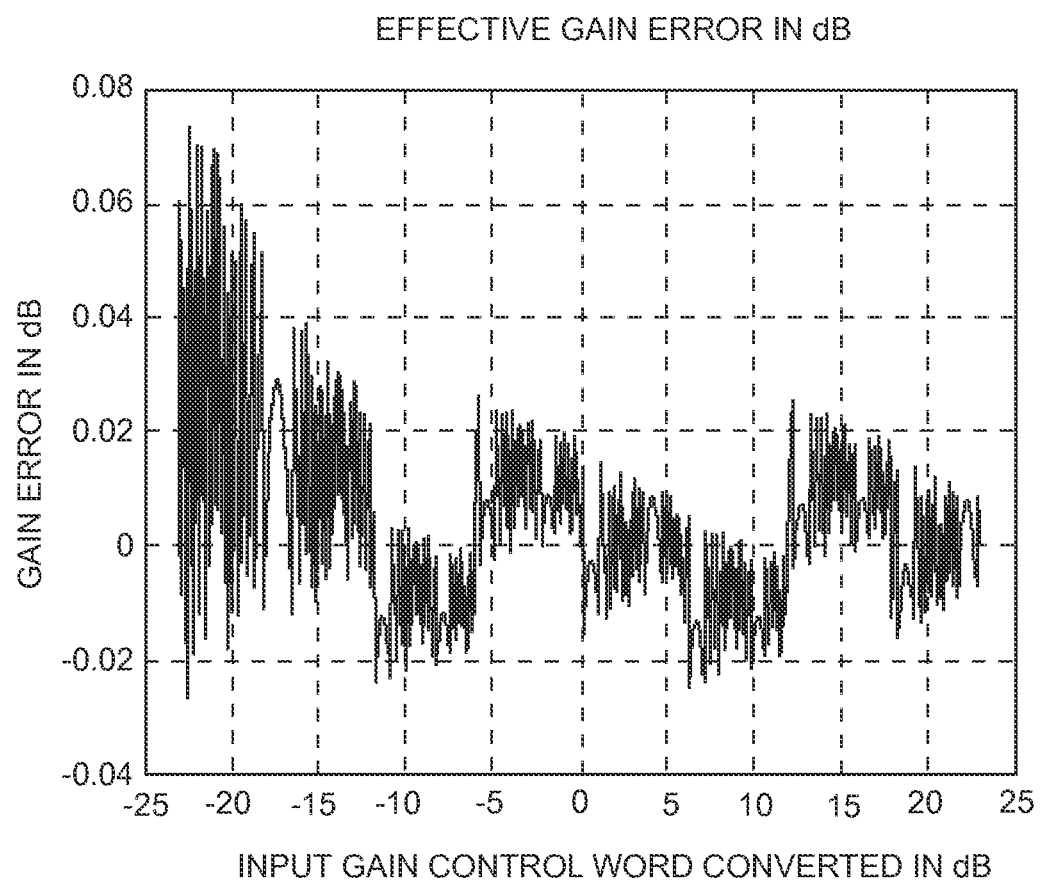
FIG. 4 is a graph of effective gain error versus input gain control word values for the second embodiment of FIG. 3.

FIG. 4 is a graph of effective gain error versus input gain control words that correspond to various log gain values for the first embodiment of the digital log gain to digital linear gain multiplier 10 (FIG. 3). In this case, the digital log gain to digital linear gain multiplier 10 is implemented as a dB to gain multiplier. Notice that the error over the +24/−12 dB range is less than ±0.03 dB when the error is expressed in dB. In this example, the input gain resolution is 0.0625 in dB.

Figure 5:
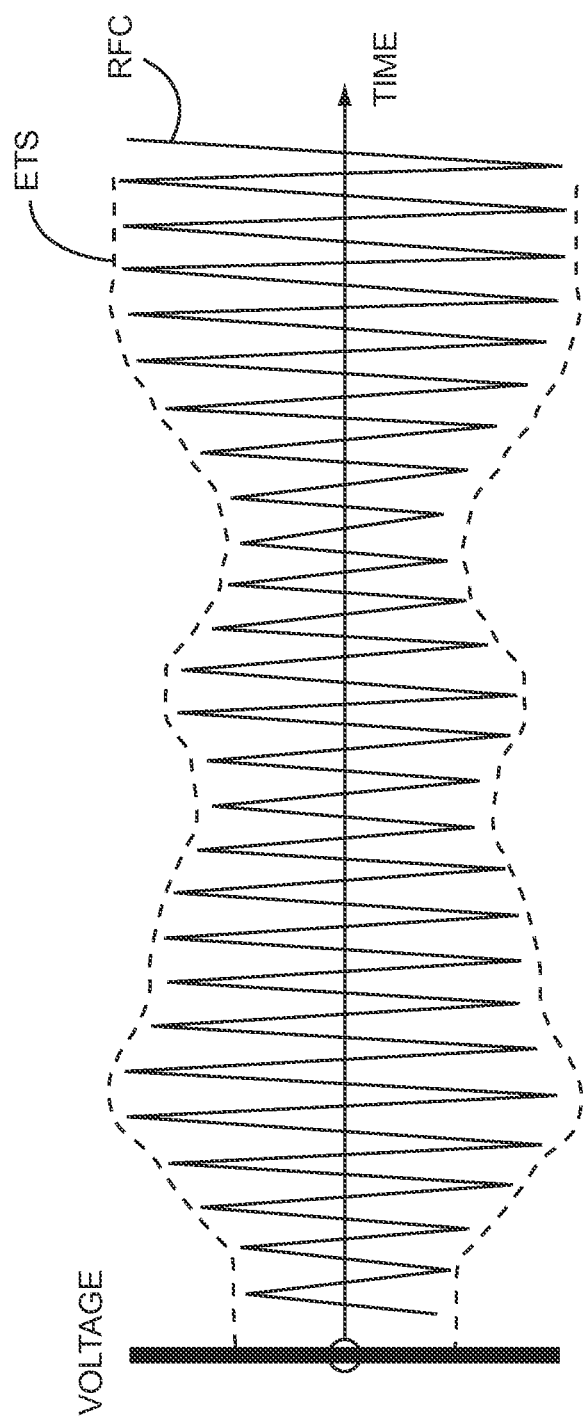
FIG. 5 is a voltage versus time graph of an envelope tracking signal that can be generated using output from embodiments of a digital log gain to digital linear gain multiplier according to the present disclosure.

FIG. 5 is a voltage versus time graph of an envelope tracking signal (ETS) that can be generated using output from embodiments of a digital log gain to digital linear gain multiplier according to the present disclosure. The ETS is shown in dashed lines and matches the modulation envelope of a modulated radio frequency carrier (RFC). The output from the present digital log gain to digital linear gain multiplier 10 does not produce the ETS directly. Instead, the present digital log gain to digital linear gain multiplier 10 is incorporated into other circuitry that generates the ETS.

Figure 6:
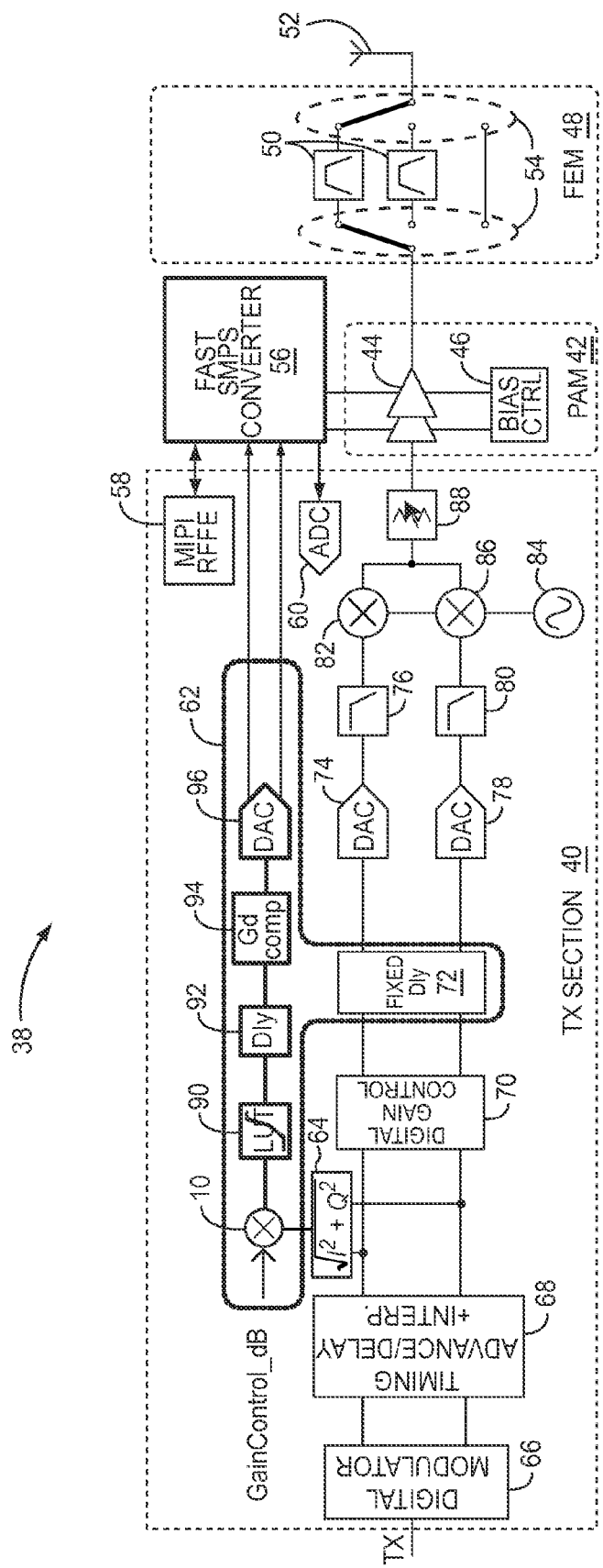
FIG. 6 is a block diagram of a digital envelope tracking system that incorporates the present digital log gain to digital linear gain multiplier.

FIG. 6 is a block diagram of a digital envelope tracking system 38 that incorporates the digital log gain to digital linear gain multiplier 10. The digital envelope tracking system 38 includes a transmitter TX section 40 that drives a power amplifier module (PAM) 42 having power amplifier stages 44 with a bias control 46. A front end module (FEM) 48 receives the output from the PAM 42 and passes the output through selectable filters 50 to a transmit antenna 52 via RF switches 54. A fast switch mode power supply (SMPS) converter 56 supplies power to the PAM 42. The fast SMPS converter 56 is controlled through a mobile industry processor interface (MIPI) RF front-end (RFFE) standard interface 58. A general purpose analog-to-digital converter (ADC) 60 is usable to monitor supply voltages provided to the PAM 42 by the fast SMPS converter 56.

The TX section 40 includes an ETS generator 62 that drives the fast SMPS converter 56 to produce the ETS (FIG. 5). The ETS generator 62 receives a log gain value contained within a digital gain control (GainControl_dB) signal along with a stream of norm outputs from a CORDIC 64.

The TX section 40 also includes a digital modulator 66 that separates a transmit signal TX into a digital in-phase (I) signal and a digital quadrature (Q) signal. A timing block 68 provides timing advances and delays for the digital I signal and the digital Q signal in response to base station requests. The timing block 68 also provides interpolation for achieving higher clock frequencies.

A digital gain control 70 provides gain to the digital I signal and the digital Q signal in cooperation with the GainControl_dB signal. The cooperation ensures that the amplitude of the ETS (FIG. 5) and the amplitude of the RFC (FIG. 5) substantially match. In at least one embodiment, the digital gain control 70 comprises one digital log gain to digital linear gain multiplier 10 for providing gain to the I signal. Another digital log gain to digital linear gain multiplier 10 is included for providing gain to the Q signal.

A fixed delay 72 on the order of nanoseconds ensures that the stream of norm values is synchronized with the propagation of the digital I signal and the digital Q signal that are output from the digital gain control 70. A first digital-to-analog converter (DAC) 74 converts the digital I signal into an analog I signal that is filtered by a first filter 76. Similarly, a second DAC 78 converts the digital Q signal into an analog Q signal that is filtered by a second filter 80.

A first mixer 82 mixes the analog I signal with an RF signal generated by an RF oscillator 84. A second mixer 86 mixes the analog Q signal with the RF signal. Mixed outputs from the first mixer 82 and the second mixer 86 combine to produce the modulated RFC shown in FIG. 5. A variable attenuator 88 is usable in cooperation with the GainControl_dB signal to adjust the gain of the RFC.

The ETS generator 62 includes the digital log gain to digital linear gain multiplier 10 that multiplies GainControl_dB with the stream of norm values output from the CORDIC 64. A look-up-table (LUT) 90 provides pre-distortion to the stream of norms to match distortion produced by the power amplifier stages 44. A programmable delay 92 is usable to finely tune synchronization between the stream of norm values and the RFC (FIG. 5). A group delay compensator 94 is included to compensate for a dynamic bandwidth response of the fast SMPS converter 56. Lastly, the ETS generator has a third DAC 96 for converting the stream of norm values into a differential output that drives the fast SMPS converter 56 to modulate power being supplied to the PAM 42.

Those skilled in the art will recognize improvements and modifications to the embodiments of the present disclosure. All such improvements and modifications are considered within the scope of the concepts disclosed herein and the claims that follow.

What is claimed is:

1. A digital log gain to digital linear gain multiplier for an envelope tracking system comprising:
    a log gain splitter including a floor function circuit adapted to split a log gain value into an integer log part that is less than or equal to the log gain value, and a remainder log part, wherein the floor function circuit outputs the integer log part in response to a scaled log gain value received by the floor function that outputs the integer log part; and an adder circuit coupled to the floor function circuit that outputs the remainder log part by summing the log gain value with the negative of the integer log part;
    a binary anti-log circuit adapted to receive the integer log part from the log gain splitter and output a binary anti-log value of the integer log part;
    a log-to-linear look up table (LUT) adapted to receive the remainder log part from the adder circuit and output a LUT value corresponding to the remainder log part; and
    a converter multiply circuit adapted to multiply the binary anti-log value from the binary anti-log circuit by the LUT value to produce a linear gain value; and
    a gain multiply circuit adapted to multiply a digital signal having a sample rate of at least 52 MHz by the linear gain value to output a gain-enhanced digital signal.

2. The digital log gain to digital linear gain multiplier of claim 1 wherein the log gain splitter further comprises a first scale multiply circuit adapted to multiply the log gain value in dB form by a constant that is approximately equal to $\log_2(10)/20$ to output the scaled log gain value.

3. The digital log gain to digital linear gain multiplier of claim 2 wherein the log gain splitter further comprises:

a second scale multiply circuit adapted to multiply the integer log part by a constant that is approximately equal to $20/\log_2(10)$ to output a scaled integer log part; and an adder circuit that adds a negative value of the scaled integer log part to output the remainder log part.

4. The digital log gain to digital linear gain multiplier of claim 1 wherein the LUT contains LUT values that correspond to remainder log parts for log gain values in base two (dB2).

5. The digital log gain to digital linear gain multiplier of claim 1 wherein the LUT contains LUT values that correspond to remainder log parts for log gain values in dB.

6. The digital log gain to digital linear gain multiplier of claim 1 further including a rounding circuit that rounds values making up the gain-enhanced digital signal.

7. An envelope tracking system comprising:
a power amplifier module (PAM);
a fast switch mode power supply (SMPS) converter adapted to supply modulated power to the PAM in response to an envelope tracking signal (ETS) that is derived from a digital signal that is gain-enhanced and having a sample rate of at least 52 MHz;
an envelope tracking signal (ETS) generator adapted to drive the SMPS converter with the ETS; and
a digital log gain to digital linear gain multiplier for adjusting the gain of the digital signal, comprising:
a log gain splitter including a floor function circuit adapted to split a log gain value into an integer log part that is less than or equal to the log gain value, and a remainder log part, wherein the floor function circuit outputs the integer log part in response to a scaled log gain value received by the floor function that outputs the integer log part; and an adder circuit coupled to the floor function circuit that outputs the remainder log part by summing the log gain value with the negative of the integer log part;
a binary anti-log circuit adapted to receive the integer log part from the log gain splitter and output a binary anti-log value of the integer log part;
a log-to-linear look up table (LUT) adapted to receive the remainder log part from the adder circuit and output an LUT value corresponding to the remainder log part; and
a converter multiply circuit adapted to multiply the binary anti-log value from the binary anti-log circuit by the LUT value to produce a linear gain value; and
a gain multiply circuit adapted to multiply the digital signal having a sample rate of at least 52 MHz by the linear gain value to output the gain-enhanced digital signal.

8. The envelope tracking system of claim 7 wherein the log gain splitter further comprises a first scale multiply circuit adapted to multiply the log gain value in dB form by a constant that is approximately equal to $\log_2(10)/20$ to output a scaled log gain value.

9. The envelope tracking system of claim 8 wherein the log gain splitter further comprises:
a second scale multiply circuit adapted to multiply the integer log part by a constant that is approximately equal to $20/\log_2(10)$ to output a scaled integer log part; and
an adder circuit that adds a negative value of the scaled integer log part to output the remainder log part.

10. The envelope tracking system of claim 7 wherein the LUT contains LUT values that correspond to remainder log parts for log gain values in dB2.

11. The envelope tracking system of claim 7 wherein the LUT contains LUT values that correspond to remainder log parts for log gain values in dB.

12. The envelope tracking system of claim 7 further including a rounding circuit that rounds values making up the gain-enhanced digital signal.

13. A method of adjusting a gain of a digital signal for an envelope tracking system having a power amplifier module (PAM), and a fast switch mode power supply (SMPS) converter adapted to supply modulated power to the PAM in response to an envelope tracking signal (ETS), comprising:
splitting a log gain value by way of a log gain splitter into an integer log part that is less than or equal to the log gain value, and a remainder log part, wherein a floor function circuit outputs the integer log part in response to a scaled log gain value received by the floor function that outputs the integer log part; and outputting the remainder log part received from an adder circuit coupled to the floor function circuit by summing the log gain value with the negative of the integer log part;
outputting a binary anti-log value of the integer log part by way of a binary anti-log circuit in response to receiving the integer log part from the log gain splitter;
outputting by way of a log-to-linear LUT an LUT value corresponding to the remainder log part in response to receiving the remainder log part from the adder circuit;
multiplying the binary anti-log value from the binary anti-log circuit by the LUT value to produce a linear gain value;
multiplying a digital signal having a sample rate of at least 52 MHz by the linear gain value by way of a converter multiply circuit;
outputting a resulting gain-enhanced digital signal by way of a gain multiply circuit;
deriving the ETS from the gain-enhanced digital signal; and
driving the SMPS converter with the ETS.

14. The method of claim 13 wherein splitting the log gain value comprises:
receiving a log gain value in dB form;
multiplying the log gain value by a constant that is approximately equal to $\log_2(10)/20$;
multiplying the integer log part by a constant that is approximately equal to $20/\log_2(10)$ to yield a scaled integer log part;
determining the remainder log part by adding a negative of the scaled integer log part to the log gain value.

15. The method of claim 13 wherein splitting the log gain value comprises:
receiving a log gain value in dB2 form; and
determining the remainder log part by adding a negative of the integer log part to the log gain value.

16. The method of claim 13 wherein the log gain value is scaled by performing a right shift byte operation.

17. The method of claim 13 wherein digital values making up the gain-enhanced digital signal are rounded to a predetermined precision.

* * * * *